(12) United States Patent
Khatibi et al.

(10) Patent No.: US 10,626,505 B2
(45) Date of Patent: Apr. 21, 2020

(54) HIGH PERFORMANCE COATING FOR HIGH-STRENGTH STEEL COLD METAL FORMING

(71) Applicant: Oerlikon Surface Solutions AG, Pfaffikon, Pfaffikon SZ (CH)

(72) Inventors: Ali Khatibi, Chur (CH); Mirjam Arndt, Bad Ragaz (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 187 days.

(21) Appl. No.: 15/553,214

(22) PCT Filed: Feb. 19, 2016

(86) PCT No.: PCT/EP2016/053503
§ 371 (c)(1),
(2) Date: Aug. 24, 2017

(87) PCT Pub. No.: WO2016/135047
PCT Pub. Date: Sep. 1, 2016

(65) Prior Publication Data
US 2018/0237922 A1    Aug. 23, 2018

Related U.S. Application Data

(60) Provisional application No. 62/120,011, filed on Feb. 24, 2015.

(51) Int. Cl.
*C23C 14/06* (2006.01)
*C23C 28/04* (2006.01)
(Continued)

(52) U.S. Cl.
CPC ........ *C23C 28/048* (2013.01); *C23C 14/0664* (2013.01); *C23C 14/0676* (2013.01);
(Continued)

(58) Field of Classification Search
USPC ................. 51/307, 309; 204/192.15, 192.16; 428/325, 697, 698
See application file for complete search history.

(56) References Cited

U.S. PATENT DOCUMENTS 5,449,547 A * 9/1995 Miyazaki ................ C23C 14/06
428/698
6,149,162 A * 11/2000 Tanaka ...................... C23C 8/80
277/440
(Continued)

FOREIGN PATENT DOCUMENTS

| CA | 2916640 | * | 12/2014 |
| JP | 2002 113604 A | | 4/2002 |
| WO | 2014/065892 A1 | | 5/2014 |

OTHER PUBLICATIONS

Li et al "Inlfuence of the C2H2 flow rate on gradient TiCN flims deposited by multi-arc ion plating" Applied Surface Science 283 p. 134-144 (Year: 2013).*

(Continued)

*Primary Examiner* — Archene A Turner
(74) *Attorney, Agent, or Firm* — Pearne & Gordon LLP (57) ABSTRACT

Coatings for metal forming tools or metal forming members used for cold forming of high-strength steels include a CrN lower layer and a TiCN upper layer. The lower layer is deposited closer to the substrate than the upper layer. The lower layer is made of oxygen-enriched chromium nitride exhibiting a cubic structure with preferred orientation, and the upper layer is made of hydrogen-enriched titanium carbonitride. Methods for depositing the coatings are also described.

19 Claims, 6 Drawing Sheets

(51) Int. Cl.
*C23C 14/32* (2006.01)
*C23C 14/34* (2006.01)
*C23C 14/35* (2006.01)
*C23C 28/00* (2006.01)
*B21J 13/02* (2006.01)

(52) U.S. Cl.
CPC .......... *C23C 14/325* (2013.01); *C23C 14/345* (2013.01); *C23C 14/3492* (2013.01); *C23C 14/352* (2013.01); *C23C 28/042* (2013.01); *C23C 28/044* (2013.01); *C23C 28/42* (2013.01); *B21J 13/02* (2013.01)

(56) References Cited

U.S. PATENT DOCUMENTS

| | | | |
|---|---|---|---|
| 6,274,257 B1 * | 8/2001 | Aharonov | B22C 3/00 428/698 |
| 8,152,971 B2 | 4/2012 | Quinto et al. | |
| 2002/0132141 A1 | 9/2002 | Toihara | |
| 2007/0082129 A1 * | 4/2007 | Shimoda | C23C 14/0021 204/298.02 |
| 2009/0120241 A1 | 5/2009 | Vetter | |
| 2010/0215912 A1 * | 8/2010 | Kubota | C23C 14/0641 428/172 |
| 2013/0042845 A1 * | 2/2013 | Kennedy | C23C 16/0272 277/443 |
| 2013/0101818 A1 | 4/2013 | Cha | |
| 2014/0041435 A1 | 2/2014 | Cha | |

OTHER PUBLICATIONS

International Search Report and Written Opinion for PCT/EP2016/053503 dated May 9, 2016.

* cited by examiner

HIGH PERFORMANCE COATING FOR HIGH-STRENGTH STEEL COLD METAL FORMING

The present invention relates to coatings to be applied on surfaces of forming tools or forming members such as dies and punches which are used for cold forming of high-strength steels, including in particular but not exclusively forming tools and forming members which can be used for cold forming of high-strength steel metal sheets.

The present invention relates in particular to cold forming tools and cold forming members having a substrate surface coated with a coating comprising a lower layer comprising CrN and an upper layer comprising TiCN, wherein said lower layer is deposited closer to the substrate surface than said upper layer, wherein the lower layer is made of oxygen-enriched chromium nitride exhibiting a cubic structure with preferred (200) orientation, and the upper layer 30 is made of hydrogen-enriched titanium carbonitride.

The present invention relates furthermore to coating methods for depositing the inventive coatings.

STATE OF THE ART

Advanced high strength steels (AHSS) exhibit very high tensile strengths ranging from ~550 MPa extending to above 1000 MPa and are used nowadays in many industrial applications, for example in applications in the automotive industry.

Forming of high strength steels demands the use of forming members or tools exhibiting especially high wear resistance, regarding both abrasive and adhesive wear, as well as good fatigue resistance.

A considerable quantity of surface treatments and/or coating solutions are currently commercially available for improving cold forming of high strength steels. These solutions comprise for example hardening of the surface using different nitriding methods like plasma or low pressure nitriding processes, and coating with aluminum chromium and aluminum titanium composite alloys produced by PVD, CVD and other deposition methods. However, none of these solutions meet the current demands which involve increasing requirements concerning fatigue and wear resistance in particular for cold forming of AHSS and cold forming of HSLA (high-strength low-alloy steel).

On the one side, the aforementioned surface hardening methods using nitriding processes result frequently in formation and delamination of a compound layer comprising $Fe_{2-3}C$. On the other side, the use of known coatings in their alone-standing situation is not sufficiently good enough for forming of AHSS. A more clever solution can be the combination of surface hardening treatment (e.g. nitriding) and protective coating layers (e.g. PVD-, CVD-, or similar produced layers).

In this regard Escher et al. ($6^{th}$ International Tooling Conference Proceedings, 2002, Karlstad, ISBN 9189422821, 9789189422827, page 771ff) identify as main requirement for sheet metal forming applications the reduction of adhesive wear by using PVD-coatings with a low friction coefficient and low surface roughness. According to Escher et al. surface hardening of the tools by e.g. nitriding or by applying hard protective PVD-coatings is thought to be beneficial against abrasive wear of the tools. Escher et al. describe several attempts to achieve low-friction and high hardness with various CVD- and/or PVD-coatings. The surface hardness is successfully increased by applying a CVD-titaniumcarbide (TiC) layer. The adhesive wear can be reduced by using a bilayer coating consisting of a CVD-TiC and CVD-titaniumnitride (TiN) layer. The toughness can be positively influenced by using a multilayered coating consisting of several CVD-TiC and CVD-TiN layers deposited alternately. Since these coatings can mostly not be applied on tool steels due to the high temperatures necessary during the CVD coating process, the low temperature process routines of PVD are evaluated. According to Escher et al. PVD-TiN coatings exhibit an insufficient low hardness of about 2400 HV, which can be increased by addition of carbon in order to form a PVD-titaniumcarbonitride (TiCN) coating which exhibits a hardness of about 3000 HV. Furthermore, Escher et al. teach that in spite of the low hardness of the PVD-chromiumnitride (CrN) coating which is of about 2000-2200 HV, this kind of coatings can be considered as promising if they are deposited on tool surfaces having an increased coating thickness of about 6-9 µm.

However, not a coating suggested by Escher et al. can fulfill the highly demanding requirements of the cold metal forming processes used nowadays in several industrial applications (e.g. in automotive applications), and consequently developing a coating which provides a satisfactory solution is of highest priority for the tooling industry.

More recently, Janoss et al. suggest in WO2014/065892 the use of a protective coating system for improving performance of metal forming members used for forming of AHSS alloys. The suggested coating system is expected to combine the aforementioned properties concerning fatigue-, wear- and friction-resistance. The coating system comprises a first layer disposed on the metal forming member which comprises chromium nitride doped with at least one dopant, and a second layer disposed atop the first layer which comprises a lubricious material having a coefficient of friction of less than or equal to 0.2 as measured against low alloy steel.

The dopant can be selected from the group consisting of one or more of: W, V, Ti, Zr, Co, Mo, and Ta. The second layer can be made of TiCN. The doped CrN coating according to WO2014/065892 is expected to have a multiple directional, noncolumnar structure which is believed to be responsible for the crack resistance of the doped CrN. While the undoped CrN exhibits a strong preferred (220) orientation in the XRD pattern, the doped CrN films were identified to have a multitude of detected orientations, namely (111), (200) and (220) with a slight preferred (220) orientation. The dopant can be present in a range of 1 to 10 atomic percent, preferably in a range between 3 and 7 at. %, more preferably the dopant content is of 5 at. %. The overall hardness of the coating system should be about 3600-3800 HV.

Attaining a coefficient of friction of less than or equal to 0.2 as measured against low alloy steel is not easy and involves undesirable limitations concerning the selection of the coating parameters and or coating techniques.

On these grounds there is still a need of developing new coatings which allows to improve the performance of cold forming tools for attaining higher wear and fatigue resistance during cold forming operations of AHSS and HSLA.

OBJECTIVE OF THE INVENTION

It is an objective of the present invention to provide a coating that can offer satisfactory resistance to abrasive and adhesive wear as well as satisfactory resistance to fatigue of forming tools or members used by cold forming of the above-mentioned high-strength steels, in particular concerning AHSS and HSLA. Furthermore, it is desired that the coating according to the present invention is not limited by exhibiting a coefficient of friction at the coating surface having a value of 0.2 or lower as measured against low alloy steel, as it is specified in the above mentioned state of the art.

DESCRIPTION OF THE PRESENT INVENTION

The objective of the present invention is attained by providing a coating 10 comprising at least one lower layer 20 comprising chromium oxynitride (CrON or CrNO) and at least one upper layer 30 comprising titanium carbonitride (TiCN), characterized by comprising three intermediate layers 41, 42, 43 provided between the at least one lower layer 20 and the at least one upper layer 30, wherein the first intermediate layer 41 is provided closest to the lower layer 20 and comprises chromium nitride (CrN), the second intermediate layer 42 is provided on the first intermediate layer 41 and comprises titanium chromium nitride (TiCrN), and the third intermediate layer 43 is provided on the second intermediate layer 42 and comprises titanium chromium carbonitride (TiCrCN).

The present invention and preferred embodiments of the present invention will be explained in the following and exemplarily supported by figures. The following explanations and examples are not intended to limit the present invention but only to help to understand the invention and to show ways in which the invention can be put into practice.

Figure 1:
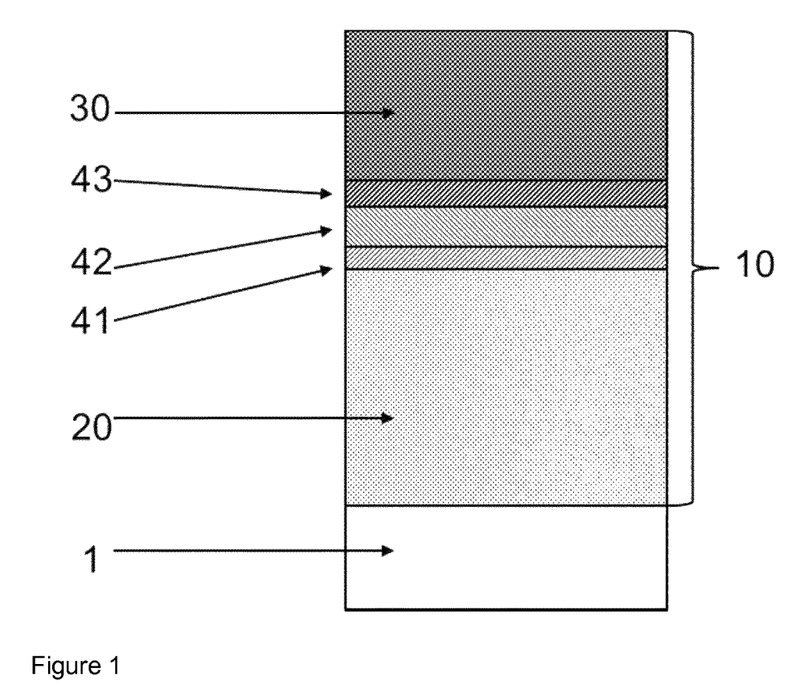
FIG. 1: Represents a schematic drawing of the inventive coating architecture, including the coating 10, which comprises a lower functional layer 20 $CrN_yO_x$, followed by three intermediate layers 41, 42, 43 which are located in between lower functional layer 20 and upper functional layer 30, which is composed of TiCN:H.

A schematic drawing of a preferred embodiment of the present invention is shown in FIG. 1. This coating 10 comprises five layers 20, 30, 41, 42, 43. The lower layer 20 is provided directly on the surface of the substrate 1 and the upper layer 30 is provided as outermost layer. These two layers 20, 30 are counted as functional layers. The three intermediate layers 41, 42, 43 are provided primarily in order to enhance the adhesion among the functional layers 20, 30.

The overall thickness of the intermediate layers 41, 42, 43 as shown in FIG. 1 can be for example about 5-20% of the overall thickness coating 10. It means that, if for example the overall thickness of the coating 10 (the sum of the thicknesses of all layers present in the coating system 10 in FIG. 1, i.e. thickness of lower layer 20+thickness of first intermediate layer 41+thickness of second intermediate layer 42+thickness of third intermediate layer 43+thickness of upper layer 30) is about 10 µm, the sum of the thicknesses of the intermediate layers 41, 42, 43 could be about 1 µm. However this example should not be seen as a limitation of the invention.

Figure 2A:
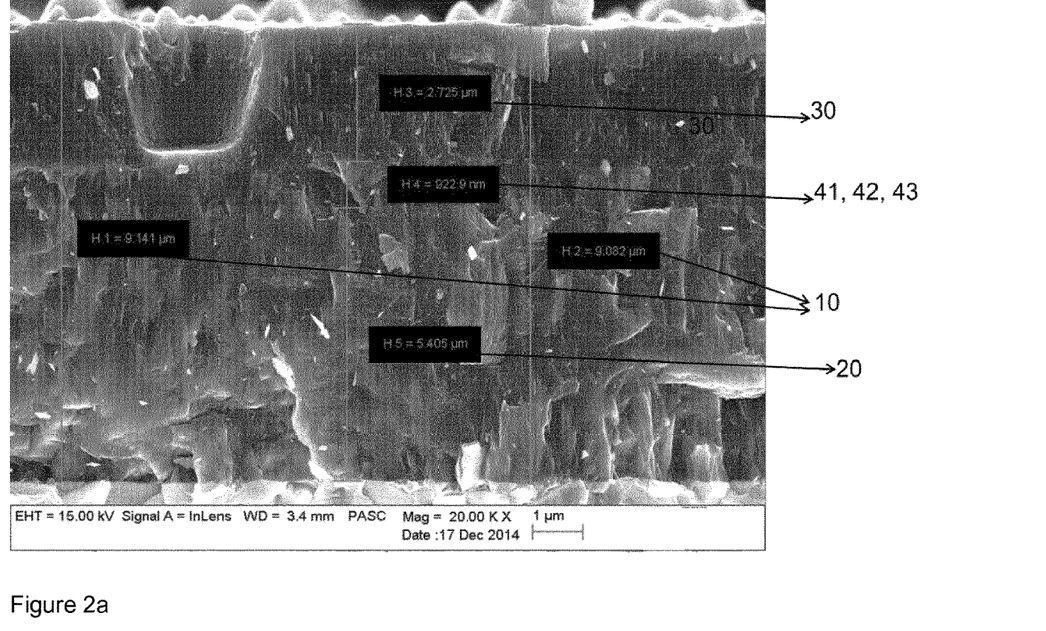
FIG. 2a: Exhibits an SEM fracture cross section of the inventive coating architecture, including the coating 10, which comprises an adhesion layer deposited on the substrate surface and composed of CrN, a lower functional layer 20 composed of $CrN_yO_x$ deposited on the surface of the adhesion layer, followed by three intermediate layers 41, 42, 43 which are located in between functional lower layer 20 and upper layer 30, which is composed of TiCN:H. For further details see experimental details.
Figure 2B:
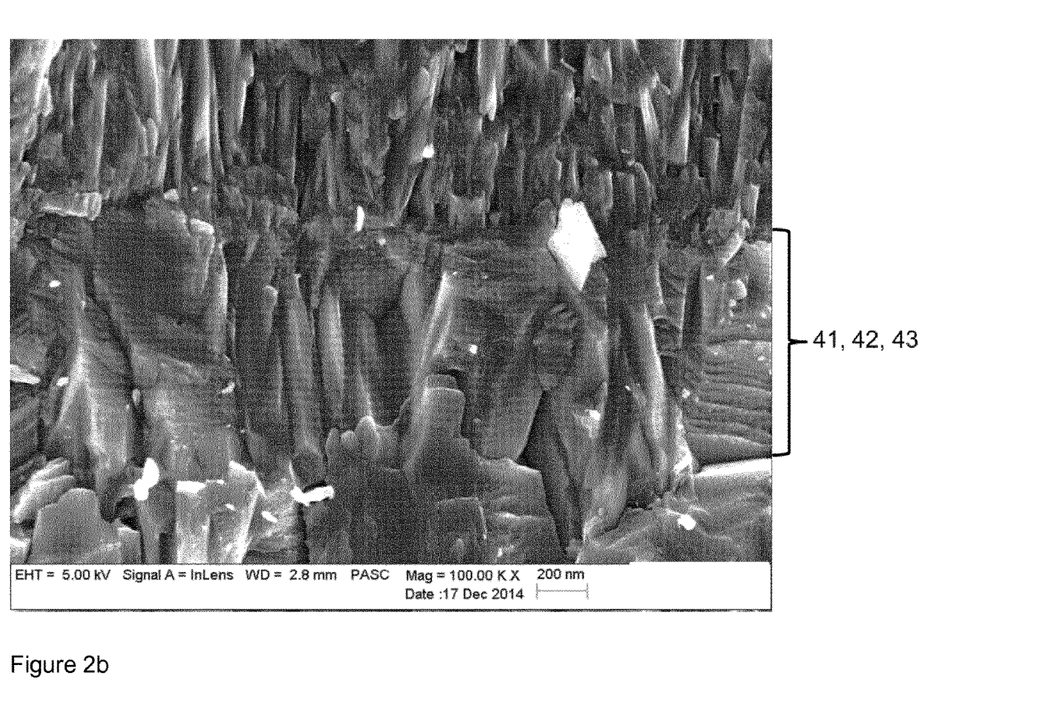
FIG. 2b: Exemplary highlights the intermediate layer section of the inventive coating, where the columnar character of the coating 20, as well as the three intermediate layer 41, 42, 43 and the toplayer 30 can clearly be seen.

FIGS. 2a and 2b show SEM micrographs of a coating having a layer structure as it is schematically shown in FIG. 1.

The lower functional layer 20 can be provided directly on the surface of the forming tool or member and is preferably an oxygen-doped chromium nitride layer (also referred to as CrON layer in the context of the present invention) with preferably a chemical composition corresponding to the general formula of $CrNO_x$ in which $0.20<x<0.45$, wherein x is the proportion of oxygen in atomic percentage if the sum of the content of the nonmetallic coating constituents N and O in atomic percentage is considered to be 100 at. %. It means that for example, if the overall concentration of the constituents measured in atomic percentage in a lower functional layer 20 consisting of oxygen-enriched chromium nitride is 43 at. % of chromium, 42 at. % of nitrogen and 15 at. % of oxygen, then x is 0.263.

In the context of the present invention the term oxygen-doped layer or hydrogen-doped layer has the same meaning that the term oxygen-enriched layer or hydrogen-enriched layer. It means that for example an oxygen-doped chromium nitride layer is an oxygen-enriched chromium nitride layer in the context of the present invention and it is to be understood that an oxygen-enriched chromium nitride layer is a layer comprising mostly chromium nitride but comprising also oxygen. Similarly it means that for example a hydrogen-doped titanium carbonitride layer is a hydrogen-enriched titanium carbonitride layer in the context of the present invention and it is to be understood that a hydrogen-enriched titanium carbonitride layer is a layer comprising mostly titanium carbonitride but comprising also hydrogen.

The upper functional layer 30 comprises preferably titanium, carbon, nitrogen or more preferably titanium, carbon, nitrogen and hydrogen. In the last case its chemical composition satisfies preferably the general formula $TiC_pN_q:H_z$ in which $0.6 \leq p+q \leq 0.8$, $0.33 \leq p/q \leq 4$ and $0.2 \leq z \leq 0.4$, wherein p, q and z refer to the nonmetallic coating constituents and their sum is normalized to 100% with respect to the metallic constituent titanium.

Preferably the carbon content and nitrogen content in the upper functional layer 30 vary from bottom towards top of the layer. More preferably carbon content increases from the bottom towards the top, while nitrogen content decreases from the bottom towards the top within the upper layer 30.

The first, second and third intermediate layers 41, 42, 43 are preferably made of chromium nitride (CrN), titanium chromium nitride (TiCrN), and titanium chromium carbonitride (TiCrCN) or hydrogen-enriched titanium chromium carbonitride compounds, respectively.

Preferably the chromium content in the second and third intermediate layer decreases over the thickness from the bottom of the second intermediate layer 42 towards the top of the third intermediate layer 43, preferably from a concentration of 50 at. % to a concentration of zero, considering the measured concentration of all metallic and nonmetallic elements Preferably the titanium content in the second and third intermediate layer increases over the thickness from the bottom of the second intermediate layer 42 towards the top of the third intermediate layer 43, preferably from a concentration of zero to a concentration of 40 at. %, the concentration measured in atomic percentage considering all metallic and nonmetallic elements.

According to a further preferred embodiment of the present invention, the coating 10 comprises at least one more chromium nitride (CrN) layer, preferably stoichiometric CrN, deposited as interlayer between the substrate 1 and the lower functional layer 20.

The inventive coatings can preferably be deposited by using physical vapor deposition (PVD) methods, for example magnetron sputtering and/or HIPIMS and/or arc-PVD.

For a particular example, a coating according to the present invention was produced by using arc-sources comprising elemental metallic targets made of Cr and Ti. For depositing the lower functional layer 20 one or more Cr-targets were arc-evaporated in a coating chamber comprising essentially oxygen and nitrogen as reactive gases for forming oxygen-enriched CrN. For depositing the first intermediate layer 41, only nitrogen flow was further introduced as reactive gas in the coating chamber and no more oxygen flow was introduced in order to form CrN. For depositing the second intermediate layer 42 additionally one or more Ti-targets were arc-evaporated in the nitrogen reactive atmosphere in order to form TiCrN. For depositing the third intermediate layer a carbon-containing gas, in this case an acetylene flow was introduced in the coating chamber in order to form TiCrCN. For depositing the upper functional layer 30, the nitrogen flow was gradually reduced and the acetylene flow was gradually increased in order to form TiCN.

Other coatings according to the present invention were deposited by using a similar coating process as described above, but in which already during the step comprising the deposition of the third intermediate layer 43, the nitrogen flow was reduced gradually.

The inventors observed that surprisingly by producing the inventive coating as described above, hydrogen-enriched TiCN layers were deposited which exhibited particularly good properties for protecting and enhancing performance of cold forming tools and cold forming members. In particular by forming of AHSS metal sheets. It is supposed that the hydrogen content detected in the carbon containing layers deposited as described above come from the acetylene gas used as carbon-containing gas for synthetizing these layers.

The inventors observed that particularly advantageous coating properties can be attained when a negative substrate bias is applied during coating process, in particular in such a manner that for depositing the first functional layer 20 the negative substrate bias is adjusted at a lower absolute value than for depositing the upper functional layer 30.

Particularly good coating performances were attained by applying a negative substrate bias having absolute value between 40 and 100 V, in particular between 50 and 80V during deposition of the lower functional layer 20 made essentially of CrON, and by increasing the negative substrate bias up to a level between 70 and 150V in absolute value, in particular between 80 and 120V, for depositing the upper functional layer 30 made essentially of hydrogen-enriched TiCN.

Also an advantageous coating performance was obtained by increasing the negative substrate bias gradually from the low bias level used for depositing the lower functional layer 20 to a higher bias level used for depositing the upper functional layer 30.

A preferred embodiment of a method for depositing coatings according to the present invention comprises increasing the negative bias voltage from the low bias level used for depositing the lower functional layer 20 to a higher bias level used for depositing the upper functional layer 30 in such a manner that the increment is performed over the deposition of the second intermediate TiCrN layer 42. This increment of the bias voltage can be for example be performed gradually.

In order to attain a further enhancement of the tool performance, some cold forming tools were hardened by using a nitriding process prior to the deposition of the coating according to the present invention.

Both nitriding and coating process steps were conducted in the same coating machine. However it is also possible to do it by conducting a preceding nitriding step in a nitriding machine followed by a coating step in a separate coating machine adapted for conducting PVD coating processes.

Most of the coatings produced, examined and tested within the scope of the present invention were produced at a coating machine of the type Innova of the Company Oerlikon Balzers. However it should not be understood as a limitation of the scope of the present invention because the coating according to the present invention can be deposited in any kind of coating machine, in particular in any kind of coating machine which allows the execution of reactive PVD coating processes. Inventive coatings were for example also deposited at coating machines of the type BAI1200 and BAI1200XL of the same Company.

As showcase of the present invention, some inventive coatings having properties as described below were produced, examined and tested. These properties should however in no case be understood as a limitation to the scope of the present invention.

The thickness of the lower functional layer 20 of CrNO was in the range of 4 to 5.5 µm. In terms of mechanical properties, this layer shows hardness (HIT) and elastic modulus (EIT) of about 30±2 GPa and 292±9 GPa, respectively, and exhibited a fine-grained structure comprising grains having a grain size of about 10-15 nm (measured by using XRD-examinations).

The thickness of the upper functional layer 30 of hydrogen-containing TiCN was in the range of 2.8 to 3.2 µm. The hardness (HIT) and elastic modulus (EIT) of this layer varied from bottom towards the surface and was in the range of 33 to 55 GPa and 330 to 420 GPa, respectively. The coefficient of friction (COF) in the non-polished state and against 100Cr6 steel was determined and the value obtained was about 0.5±0.1. This COF value was determined in pin-on-the-disc tests executed at room temperature using a 100Cr6 steel ball and a normal load of 10 N and a linear speed of 30 cm/sec.

The total thickness of the intermediate layers 41, 42, 43 (the sum of the thicknesses of the first, second and third layer) varied between 0.7 and 1 µm. The thickness of each one of the intermediate layers was also varied. Particularly good results were obtained in some cases when the thickness of the first intermediate layer 41 and the thickness of the third intermediate layer 43 were similar and the thickness of the second intermediate layer 42 was thicker. However this observation should be not understood as a limitation of the present invention.

Figure 3:
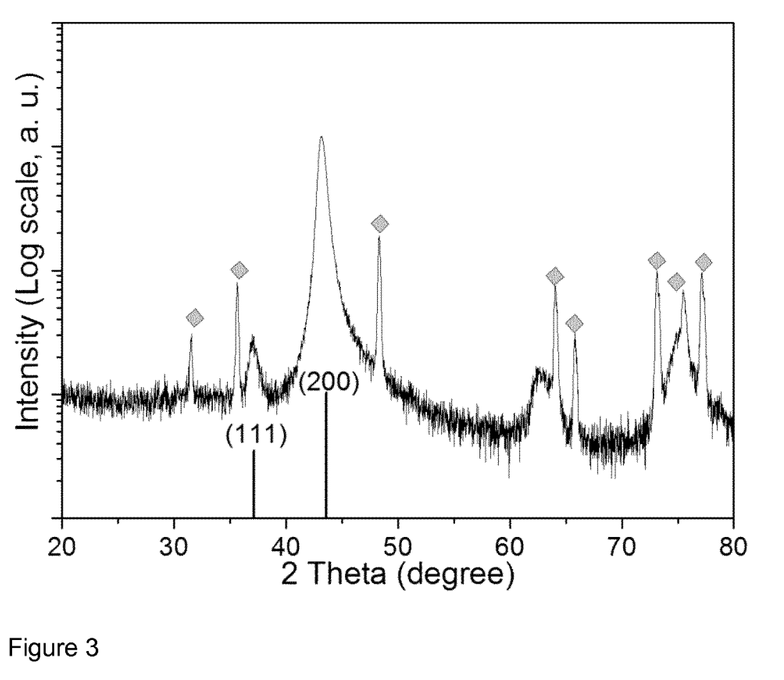
FIG. 3: Illustrates an XRD pattern of a single $CrN_yO_x$ layer on a WC substrate, which can be used as lower functional layer 20, according to the description.

FIG. 3 shows a theta/2theta diffraction pattern of an oxygen-enriched CrN film (also referred to as CrON film or layer in the context of the present invention) deposited according to the present invention, which can be preferably deposited as lower functional layer 20. The coating has a cubic structure and the peak intensity ratio of (200) to (111) reflections varies from 24 to 40. Substrate peaks are marked in FIG. 3 with rectangles in order to facilitate the differentiation from the peaks corresponding to the CrON film.

The resistance of the total coating to wear and fatigue was tested using an impact-sliding test in which, an SAE 52100 steel ball with a 10-mm diameter hits and slides over the surface of the coating through a defined mechanism. The ball hits the coating surface with an impact loading of 200-400 N and then slides downward for about 3 to 4 mm in a time frame of 0.1 s. The impacts can be produced describing a motion in the perpendicular direction to the coated surface to be tested or having a motion in an oblique direction to the coated surface to be tested. The impacts can be repeated for 3000 or 5000 cycles. In a more severe testing condition, the impact loading can be increased to 300-600 N. Using this testing method, several coating failure mechanisms such as fatigue cracks, adhesive wear, coating chipping and complete delamination may be identified.

By using this test the inventors determined the superiority of the inventive coatings in comparison with other coatings which belong to the state of the art and which are currently being used for cold metal forming of AHSS metals.

The superiority of the inventive coatings was also demonstrated by strip-drawing tests.

Coatings deposited according to the present invention on cold forming tools and members made of cold working steel 1.2379 showed in first experiments about ~30% better performance compared TiCrN-based coatings and CrN-based coatings. In a comparative industrial test, the inventive coatings allows the manufacture of 64000 parts without presenting failure, while by using the comparative coatings mentioned above only 50000 Parts could be manufactured.

Further details and preferred embodiments of the present invention:

According to one preferred embodiment of the present invention the lower functional layer 20 has a chemical composition given by the general formula of $CrN_yO_x$, with x and y fulfilling the condition $0.20 \leq x \leq 0.45$ and $0.55 \leq y \leq 0.8$, respectively, wherein x and y refer to the atomic proportion of the nonmetallic coating constituents oxygen and nitrogen, respectively, these atomic proportions being obtained when the sum of the atomic content of O and N is normalized to 1 with respect to the metallic coating constituent chromium.

While aforementioned literature reports aim for of doped CrN with dopant levels of lower than 10 at. % in order to obtain a preferred (220) orientation, the inventors surprisingly found that by using oxygen as dopant element at levels of more than 10 at. % considering the overall element composition in the doped CrN layer, thus in particular when the oxygen-doped layer has composition as described by the formula $CrN_yO_x$ layer with $0.20 \leq x \leq 0.45$, it can result in the formation of a preferred (200) orientation, which can be seen in FIG. 3, which unexpectedly fulfills the needs as a highly stable lower functional layer for forming tool operations. A preferred peak intensity ratio of (200)/(111) reflections varies from 10 to 50, more preferably from 24 to 40.

Preferably $CrN_yO_x$ is stoichiometric over the whole range of thickness of the lower functional layer 20. It was found that particularly good results can be obtained if the oxygen to nitrogen ratio is constant within the lower functional layer 20, which can be achieved by e.g. adjusting the nitrogen to oxygen gas flows at a fixed ratio during deposition of the $CrN_yO_x$ layer.

Another preferred embodiment of the present invention the $CrN_yO_x$ layer 20 exhibits grain sizes of 8-16 nm, more preferably between 10-12 nm as obtained from peak fitting of the (200) reflection in FIG. 3. In this grain size regime particularly good mechanical properties were obtained.

According to a preferred embodiment of the present invention a dopant free CrN interlayer is deposited between substrate 1 and lower functional layer $CrN_yO_x$ 20, which avoids unintended oxidation of the tool substrate and can significantly enhance adhesion of the functional layer.

According to a preferred embodiment of the present invention the thickness of the lower functional layer 20 is about 49-59% of the overall coating thickness. The proportion of the lower functional layer allows for an improvement of the crack resistance and stress control of the inventive coatings during growth of relatively thick coatings of more than 6 μm total thickness.

Figure 5:
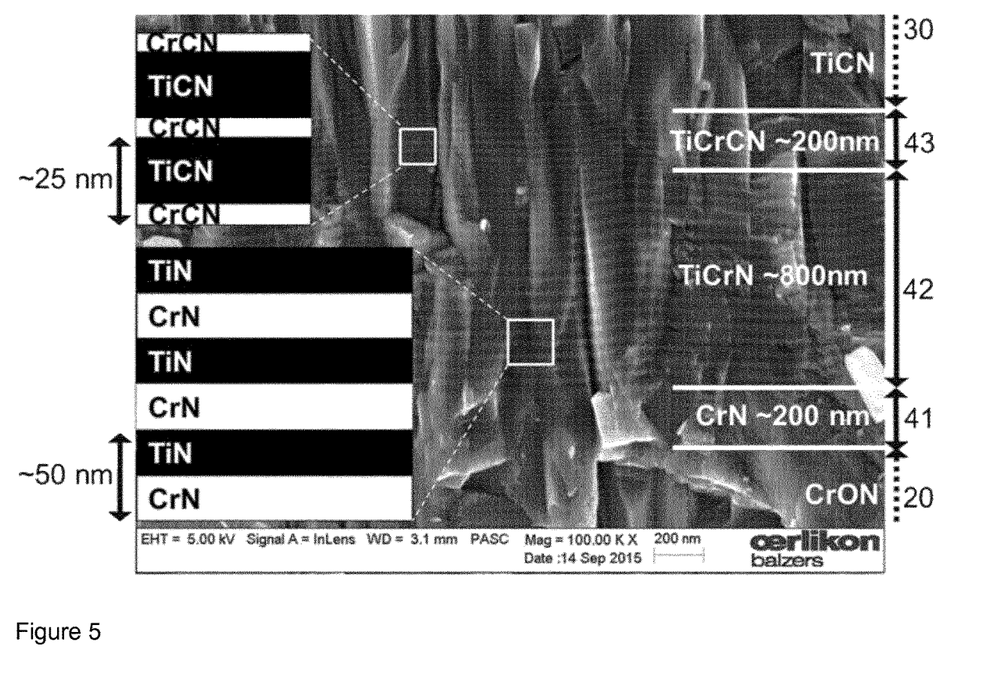
FIG. 5: Exemplary highlights the intermediate layer system, being composed of a lower intermediate CrN layer 41, a middle intermediate layer of TiN and CrN nanolayers 42, and an upper intermediate layer of TiCN and CrCrN which can include hydrogen 43, of the middle section of the inventive coating 10, accompanied by the lower layer 20 and an upper layer 30.

According to a further preferred embodiment of the present invention the sum of the thicknesses of the intermediate layers 41, 42, 43 is about 11-18% of the overall coating thickness. Details of the intermediate layers 41, 42, and 43 are shown in an SEM micrograph in FIG. 5. It shows that the middle TiCrN compound layer 42 has almost double the thickness of the underlying CrN layer 41 and overlying TiCrCN layer 43. In order to have a smooth transition from the bottom CrON layer 20 to the top TiCN:H layer 30, the contents of chromium and nitrogen decrease while the content of titanium and carbon increase. The former is schematically replicated by a relative comparison of the thicker CrN nanolayer in layer 42 to the thinner CrCN nanolayer in layer 43. The latter is schematically replicated by a relative comparison of the thicker TiCN nanolayer in layer 43 to the thinner TiN nanolayer in 42 and can comprise hydrogen. This sophisticated intermediate layer concept allows for an optimized adhesion of the hydrogen doped TiCN:H layer 30 and enables for an overall performance increase of the coating in forming tool applications.

According to a further preferred embodiment of the present invention the thickness of the upper functional TiCN:H layer 30 is about 27-36% of the overall coating thickness. A significant improvement of the performance of the inventive coating can be achieved if the upper layer of the coating is less than 50% of the total coating thickness, preferably between 27-36%.

Figure 4:
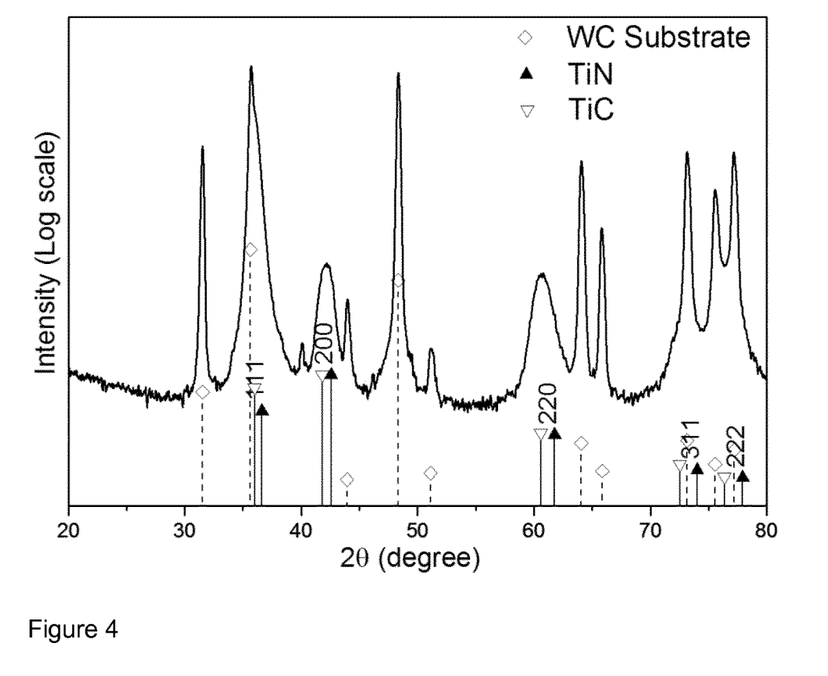
FIG. 4: Illustrates an XRD pattern of a single TiCN:H layer on a WC substrate, which can be used as upper functional layer 30, according to the description.

According to a further preferred embodiment of the present invention the upper functional TiCN:H layer 30, has a cubic structure and a peak intensity ratio of (111) to (200) reflections from 10 to 20, which can be seen in the theta/2theta X-ray diffraction pattern in FIG. 4. The intensity values were obtained by peak fitting after subtraction of the background signal. Good mechanical properties were obtained from the toplayer 30 when the grain size ranges from 5-30 nm, more preferably between 5-20 nm, most preferably between 5-8 nm, as obtained by above mentioned peak evaluation from the (200) reflection using a Sherrer equation with form factor of 0.8.

Preferably the sum of the composition coefficients corresponding to the concentration of the nonmetal coating constituents C, N and H in the upper functional layer 30 having a chemical composition $TiC_pN_qH_z$ fulfill the condition p+q+z=1. Further, the outermost layer 30 can have a carbon and nitrogen gradient with increasing carbon and decreasing nitrogen content towards the outermost surface of the upper functional layer 30. The inventors found that an increasing carbon content, at slightly decreasing nitrogen content, towards the surface of the coating increases the hardness (HIT) and elastic modulus (EIT) of the $TiC_pN_qH_z$ layer. Surprisingly the coefficient of friction of the $TiC_pN_qH_z$ layer in the non-polished state against 100Cr6 steel was about 0.5±0.1.

Figure 6:
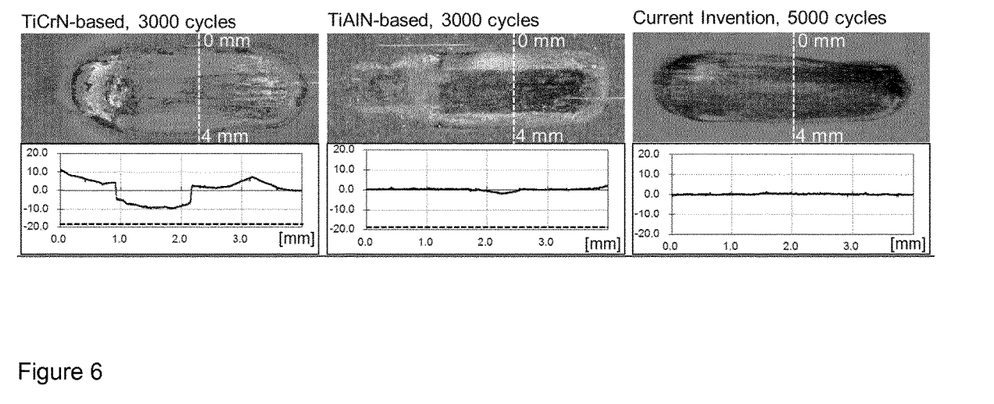
FIG. 6: Illustrates the higher wear resistance of the inventive coating compared to state of the art TiCrN and TiAlN based coatings obtained after impact sliding tests.

A result from an impact sliding test was mentioned above, where the potential coating failure mechanisms, such as fatigue cracks, adhesive wear, coating chipping and complete delamination, were evaluated. Some examples of the inventive coatings were tested against state-of-the-art TiAlN and TiCrN based coatings. Some results are presented in FIG. 6, where it can clearly be seen that an example of inventive coating could withstand the test for highest number of impact slidings while the commercially available coatings failed already at a significantly lower number of cycles.

Some of the coatings according to the present invention further showed a remarkable increase of even several times in the tool life used in forming of 1180 MPa dual phase AHHS sheet metals compared to tools which were coated with TiCrN-based reference coating. Similar tests are currently being performed with results ranging from 200-400% increased tool life vs. that of the tools coated with commercially available TiCrN coatings as well as competitor coatings.

It is important to mention that the coatings related to the present invention could be applied on forming tools or forming tool members especially for cold forming operations of high-strength steels, such as e.g. forming of metal foils, sheets, plates or blocks by e.g. deep drawing, punching, pressing, ironing, trimming, bending, stamping or the like.

Concretely the present invention discloses:

An inventive coating for metal forming tool or metal forming members, which in particular can be used for cold forming of high-strength steels, the coating comprising a lower layer 20 comprising CrN and an upper layer 30 comprising TiCN, wherein said lower layer 20 is to be deposited closer to the substrate surface of the metal forming tool 1 than said upper layer 30, and wherein
  the lower layer 20 is made of oxygen-enriched chromium nitride exhibiting a cubic structure with preferred (200) orientation, and
  the upper layer 30 is made of hydrogen-enriched titanium carbonitride.

A preferred embodiment of the inventive coating mentioned above, in which the lower layer 20 has a chemical composition corresponding to the formula $CrN_yO_x$, where 0.20≤x≤0.45 and 0.55≤y≤0.8, wherein x and y are the proportions of oxygen and nitrogen in atomic percentage if the sum of the content of the nonmetallic coating constituents N and O in atomic percentage is considered to be 100 at. % and consequently x+y=1.

A further preferred embodiment of the inventive coating mentioned above, in which the lower layer 20 has a chemical composition corresponding to the formula $CrN_yO_x$, where 0.20≤x≤0.45, preferably 0.25<x<0.40 wherein x and y are the proportions of oxygen and nitrogen in atomic percentage if the sum of the content of the nonmetallic coating constituents N and O in atomic percentage is considered to be 100 at. % and consequently x+y=1.

A coating according to any of the inventive coatings mentioned above, in which the upper layer 30 has chemical composition which satisfies the formula $TiC_pN_qH_z$, in which 0.6≤p+q≤0.8, 0.33≤p/q≤4 and 0.2≤z≤0.4, wherein p, q and z refer to the nonmetallic coating constituents and their sum is normalized to 100% with respect to the metallic constituent titanium.

A coating according to any of the inventive coatings mentioned above, in which the upper layer 30 exhibits a variation of the chemical composition along of its layer thickness, characterized by exhibiting a decrement of the nitrogen content and an increment of the carbon content in direction to the outermost surface of said upper layer 30.

A preferred embodiment of the inventive coating described directly above, in which the upper layer 30 exhibits a gradient concentration of carbon and nitrogen, wherein the carbon content increases and nitrogen content decreases towards the outermost surface of the layer, and wherein the hydrogen content remains within 0.2≤z≤0.4.

A coating according to any of the inventive coatings mentioned above, in which an intermediate layer is provided between the lower layer 20 and the upper layer 30, said intermediate layer being a multilayer system comprising a first intermediate layer 41 provided as CrN layer on the lower layer 20, a second intermediate layer 42 provided as a TiCrN layer on the first intermediate layer 41, said second intermediate layer 42 being formed as multilayer system comprising TiN and CrN nanolayers deposited alternated one of each other, and a third intermediate layer 43 provided as TiCrCN layer on the second intermediate layer 42, said third intermediate layer 43 being formed as multilayer system comprising TiCN and CrCN nanolayers deposited alternated one of each other.

A preferred embodiment of the inventive coating described directly above, in which the third intermediate layer 43 contains hydrogen.

A preferred embodiment of any of the above inventive coatings comprising an intermediate layer deposited as multilayer system as described above, in which the carbon content gradually increases from the intermediate layer 43 to the outermost surface of the upper layer 30.

A coating according to any of the above mentioned inventive coatings comprising a lower layer 20 of $CrN_yO_x$, wherein said lower functional layer 20 exhibits a XRD intensity ratio of (200)/(111) in the range of 10 to 50, preferably in the subrange from 24 to 40.

A coating according to any of the above mentioned inventive coatings comprising an upper layer 30 of $TiC_pN_q:H_z$, wherein said upper functional $TiC_pN_q:H_z$ layer 30 exhibits a cubic structure with preferred (111) orientation, preferably characterized by an XRD intensity ratio of (111)/(200) in the range of 5 to 20, more preferably in the subrange from 11 to 15.

A coating according to any of above mentioned inventive coatings, in which the lower functional layer 20 exhibits grain sizes from the (200) reflection in a range of 5-30 nm, preferably in a subrange of 8-20 nm, more preferably in a subrange of 10-15 nm.

A coating according to any of the above mentioned inventive coatings, in which the upper functional layer exhibits XRD grain sizes from the (200) reflection of 5-30 nm, more preferably between 5-20 nm, most preferably between 5-8 nm.

A coating according to any of the above mentioned inventive coatings, in which the total coating layer thickness is between 4 to 40 µm, preferably between 6 to 30 µm.

A preferred embodiment of the inventive coatings described above, in which the thickness of the lower layer 20 is a value corresponding to 49-59% of the total layer thickness of the coating.

A preferred embodiment of the inventive coatings described above, in which the sum of the thicknesses of the intermediate layers 41, 42, 43 forming the multilayer system used as intermediate layer between the lower layer 20 and the upper layer 30 is a value corresponding to 11-18% of the total layer thickness of the coating.

A preferred embodiment of the inventive coatings described above, in which the thickness of the upper layer 30 is a value corresponding to 27-36% of the total layer thickness of the coating.

A preferred embodiment of the inventive coatings described above, in which the coating further comprises an interlayer of chromium nitride, preferably stoichiometric CrN which is placed under the lower layer 20 and is to be deposited between the substrate surface of the metal forming tool 1 and lower functional layer 20 in order to improve adhesion of the coating.

An inventive metal forming tool or metal forming member coated with a coating according to any of the above mentioned inventive coatings.

A preferred embodiment of an inventive metal forming tool or metal forming member, in which the substrate surface of the forming tool 1 on which the coating is deposited is a nitrided steel surface.

An inventive deposition method for forming a coating according to any of the above mentioned inventive coatings, in which a substrate surface of a metal forming tool or forming member used for metal forming is coated by using a PVD process, wherein the deposition method comprising degassing, heating Ar-ion etching, deposition of the lower functional layer 20 of $CrN_yO_x$, deposition of the intermediate layer as multilayer system 41, 42, 43 and deposition of the upper functional layer 30 of hydrogen-enriched $TiC_pN_q{:}H_z$.

A preferred embodiment of the above mentioned inventive coating method, wherein said PVD process is a cathodic arc evaporation or sputtering or HIPIMS process, or a combination of those.

A preferred embodiment of the inventive coating method described directly above, wherein a negative bias voltage is applied at the substrate to be coated and it is kept at a constant first level between −40 V and −100 V during deposition of the lower functional layer 20 and the negative bias voltage is later increased in absolute value up to a second level between −70 V and −150 V and it is kept constant at this second level for the deposition of the upper functional layer 30, wherein the second level is higher than the first level.

A preferred embodiment of the inventive coating method described directly above, wherein the negative bias voltage is gradually increased in absolute value from the within the second intermediate layer (42).

A preferred embodiment of any of the inventive coating methods described above, wherein a nitriding process of the substrate surface to be coated is performed prior to Ar-ion substrate etching.

A preferred embodiment of any of the inventive coating methods described above, wherein a process gas is used for conducting a PVD process for depositing the intermediate layer 43 and/or the upper functional layer 30 and the used process gas comprises acetylene.

A preferred embodiment of the inventive coating method described directly above, wherein the acetylene flow is gradually increased from the deposition of the intermediate layer 43 towards the deposition of the outermost surface of the upper functional layer 30.

What is claimed is:

1. Coating deposited on a substrate surface of a metal forming tool or metal forming member for cold forming of high-strength steels, the coating comprising a lower layer (20) comprising CrN and an upper layer (30) comprising TiCN, wherein said lower layer (20) is deposited closer to the substrate (1) than said upper layer (30), characterized in that:
   the lower layer (20) is made of oxygen-enriched chromium nitride exhibiting a cubic structure with preferred (200) orientation,
   the upper layer (30) is made of hydrogen-enriched titanium carbonitride.

2. Coating according to claim 1, characterized in that the lower layer (20) has chemical composition corresponding to the formula $CrN_yO_x$ in which $0.20 \le x \le 0.45$ and $0.55 \le y \le 0.8$, wherein x and y are the proportions of oxygen and nitrogen in atomic percentage if the sum of the content of the nonmetallic coating constituents N and O in atomic percentage is considered to be 100 at. % and consequently x+y=1.

3. Coating according to claim 2, wherein
   the lower layer (20) exhibits a XRD intensity ratio of (200)/(111) in the range of 10 to 50, and/or
   the upper $TiC_pN_q{:}H_z$ layer (30) exhibits a cubic structure with preferred (111) orientation, and an XRD intensity ratio of (111)/(200) in the range of 5 to 20.

4. Coating according to claim 2, wherein
   said lower layer (20) exhibits grain sizes from the (200) reflection in the range of 5-30 nm, and/or
   said upper layer exhibits XRD grain sizes from the (200) reflection in the range of 5-30 nm.

5. Coating according to claim 2, wherein $0.25 < x < 0.40$ and $0.60 \le y \le 0.75$.

6. Coating according to claim 2, wherein
   the lower layer (20) exhibits a XRD intensity ratio of (200)/(111) in the range of 24 to 40, and/or
   the upper $TiC_pN_q{:}H_z$ layer (30) exhibits a cubic structure with preferred (111) orientation, and an XRD intensity ratio of (111)/(200) in the range of 11 to 15.

7. Coating according to claim 2, wherein
   said lower layer (20) exhibits grain sizes from the (200) reflection in the range of 8-20 nm, and/or
   said upper layer exhibits XRD grain sizes from the (200) reflection in the range of 5-20 nm.

8. Coating according to claim 2, wherein
   said lower layer (20) exhibits grain sizes from the (200) reflection in the range of 10-15 nm, and/or
   said upper layer exhibits XRD grain sizes from the (200) reflection in the range of 5-8 nm.

9. Coating according to claim 1, characterized in that the chemical composition of the upper layer (30) satisfies the formula $TiC_pN_qH_z$ in which $0.6 \le p+q \le 0.8$, $0.33 \le p/q \le 4$ and $0.2 \le z \le 0.4$, wherein p, q and z refer to the nonmetallic coating constituents and their sum is normalized to 100% with respect to the metallic constituent titanium.

10. Coating according to claim 1, characterized in that the upper layer (30) exhibits a variation of the chemical composition along of its layer thickness, wherein the nitrogen content decreases and the carbon content increases in direction to the outermost surface of said upper layer (30).

11. Coating according to claim 1, characterized in that an intermediate layer is provided between the lower layer (20) and the upper layer (30), said intermediate layer being a multilayer system comprising a first intermediate layer (41) provided as CrN layer on the lower layer (20), a second intermediate layer (42) provided as a TiCrN layer on the first intermediate layer (41), and a third intermediate layer (43) provided as TiCrCN layer on the second intermediate layer (42).

12. Coating according claim 11, characterized in that the second intermediate layer (42) is formed as multilayer system comprising TiN and CrN nanolayers deposited alternated one of each other, and/or the third intermediate layer (43) is formed as multilayer system comprising TiCN and CrCN nanolayers deposited alternated one of each other.

13. Coating according to claim 11, characterized in that the third intermediate layer (43) contains hydrogen.

14. Coating according to claim 11, characterized in that the carbon content gradually increases from the intermediate layer (43) to the outermost surface of the upper layer (30).

15. Coating according to claim 1, characterized in that:
an intermediate layer is provided between the lower layer (20) and the upper layer (30), said intermediate layer being a multilayer system comprising a first intermediate layer (41) provided on the lower layer (20), a second intermediate layer (42) provided on the first intermediate layer (41), and a third intermediate layer (43) provided on the second intermediate layer (42), and
the coating exhibits relative thicknesses of 29-59%, 11-18%, and 27-36% of the total coating thickness for the lower functional layer (20), the sum of the intermediate layers (41)+(42)+(43), and the outer functional layer (30), respectively.

16. Method for coating substrate surfaces of a forming tool or forming member 1 with a coating according to claim 1, wherein the method comprises:
introducing the tools or members to be coated in a vacuum coating chamber
degassing of the coating chamber,
heating and Ar-ion etching of substrate surfaces to be coated
using PVD processes for depositing the coating layers,
characterized in that the PVD processes are cathodic arc evaporation and/or sputtering and/or HIPIMS processes, or a combination of those, and a negative bias voltage is applied at the substrate to be coated and the negative bias voltage is kept constant at a first value between −40 and −100 V during the deposition of the lower layer (20) and the negative bias voltage is increased up to a second value between −70 and −150 V and it is kept constant for depositing the outermost functional layer (30), wherein the second value is higher than the first value.

17. Method according to claim 16, characterized in that:
an intermediate layer is provided between the lower layer (20) and the upper layer (30), said intermediate layer being a multilayer system comprising a first intermediate layer (41) provided on the lower layer (20), a second intermediate layer (42) provided on the first intermediate layer (41), and a third intermediate layer (43) provided on the second intermediate layer (42), and
the negative bias voltage is gradually increased from the within the second intermediate layer (42).

18. Method according to claim 16, wherein a process gas comprising acetylene is used for forming the upper layer (30).

19. A method according to claim 18, wherein the acetylene flow is gradually increased from the deposition of the intermediate layer 43 towards the deposition of the outermost surface of the upper layer (30).

* * * * *